(12) United States Patent
Bai (10) Patent No.: US 11,578,202 B2
(45) Date of Patent: Feb. 14, 2023

(54) LIQUID COMPRESSION MOLDING ENCAPSULANTS

(71) Applicant: Henkel AG & Co. KGaA, Duesseldorf (DE)

(72) Inventor: Jie Bai, Aliso Viejo, CA (US)

(73) Assignee: Henkel AG & Co. KGaA, Duesseldorf (DE)

( * ) Notice: Subject to any disclaimer, the term of this patent is extended or adjusted under 35 U.S.C. 154(b) by 0 days.

(21) Appl. No.: 17/306,869

(22) Filed: May 3, 2021

(65) Prior Publication Data

US 2021/0253844 A1 Aug. 19, 2021

Related U.S. Application Data

(63) Continuation of application No. 14/615,570, filed on Feb. 6, 2015, now abandoned, which is a continuation
(Continued)

(51) Int. Cl.
*C08L 63/00* (2006.01)
*C08K 3/36* (2006.01)
(Continued)

(52) U.S. Cl.
CPC ............. *C08L 63/00* (2013.01); *C08K 3/36* (2013.01); *C08L 71/02* (2013.01); *H01L 21/561* (2013.01); *H01L 21/565* (2013.01); *H01L 21/566* (2013.01); *H01L 21/568* (2013.01); *H01L 21/77* (2013.01); *H01L 23/3107* (2013.01); *H01L 24/19* (2013.01); *H01L 24/96* (2013.01); C08G 73/0233 (2013.01); C08G 73/0655 (2013.01); C08L 53/00 (2013.01); C08L 61/06 (2013.01); *C08L 79/02* (2013.01); *C08L 79/04* (2013.01); *C08L 79/085* (2013.01);
(Continued)

(58) Field of Classification Search
CPC .... C08L 63/00–10; C08L 71/02; C08L 53/00; C09D 163/00–10; C09D 171/02; C09D 153/00; C09J 163/00–10; C09J 171/02; C09J 153/00; C08J 2363/00–10; C08J 2471/02; C08G 59/42
See application file for complete search history.

(56) References Cited

U.S. PATENT DOCUMENTS 4,477,629 A 10/1984 Hefner
4,528,366 A 7/1985 Woo et al.
(Continued)

FOREIGN PATENT DOCUMENTS

GB 1305702 2/1973
JP 2009-200274 9/2009
(Continued)

OTHER PUBLICATIONS

George Wypych, Handbook or Polymers, 2nd ed., pp. 390-393 (2016).
(Continued)

*Primary Examiner* — Kregg T Brooks
(74) *Attorney, Agent, or Firm* — Steven C. Bauman (57) ABSTRACT

Thermosetting resin compositions useful for liquid compression molding encapsulation of a reconfigured wafer are provided. The so-encapsulated molded wafer offers improved resistance to warpage, compared to reconfigured wafers encapsulated with known encapsulation materials.

6 Claims, 2 Drawing Sheets

Related U.S. Application Data of application No. PCT/US2013/054396, filed on Aug. 9, 2013.

(60) Provisional application No. 61/682,417, filed on Aug. 13, 2012.

(51) Int. Cl.
  *H01L 21/56* (2006.01)
  *H01L 23/31* (2006.01)
  *H01L 23/00* (2006.01)
  *C08L 71/02* (2006.01)
  *H01L 21/77* (2017.01)
  *C08L 53/00* (2006.01)
  *C08L 61/06* (2006.01)
  *C08L 79/04* (2006.01)
  *C08G 73/02* (2006.01)
  *C08L 79/02* (2006.01)
  *C08G 73/06* (2006.01)
  *C08L 79/08* (2006.01)

(52) U.S. Cl.
  CPC .............. *H01L 2224/12105* (2013.01); *H01L 2924/181* (2013.01); *H01L 2924/3511* (2013.01)

(56) References Cited

U.S. PATENT DOCUMENTS

| | | | |
|---|---|---|---|
| 6,894,113 B2 | 5/2005 | Court et al. | |
| 6,933,179 B1 | 8/2005 | Tanaka | |
| 7,820,760 B2 | 1/2010 | Pham et al. | |
| 7,670,649 B2 | 3/2010 | Hoyles et al. | |
| 7,745,535 B2 | 6/2010 | Schmidt et al. | |
| 2003/0158337 A1 | 8/2003 | Choate et al. | |
| 2003/0207117 A1 | 11/2003 | Ueda et al. | |
| 2005/0154089 A1 | 7/2005 | Taylor et al. | |
| 2008/0188626 A1 | 8/2008 | Verghese et al. | |
| 2008/0269430 A1 | 10/2008 | Muthiah | |
| 2008/0287595 A1 | 11/2008 | Verghese et al. | |
| 2009/0123759 A1 | 5/2009 | Pham et al. | |
| 2011/0114257 A1 | 5/2011 | Kramer et al. | |
| 2011/0133344 A1 | 6/2011 | Nguyen et al. | |

FOREIGN PATENT DOCUMENTS

| | | |
|---|---|---|
| KR | 1020060028399 | 3/2006 |
| WO | 8502184 | 5/1985 |
| WO | 2009018193 | 2/2009 |
| WO | 2010008931 | 1/2010 |
| WO | 2010102421 | 9/2010 |
| WO | 2011063327 | 5/2011 |
| WO | 2011123173 | 10/2011 |
| WO | 2012087459 | 6/2012 |
| WO | 2013095908 | 6/2013 |

OTHER PUBLICATIONS

Hirose et al., "Dielectric study of dynamical heterogeneity in blends of polyethers", J. Non-Crystalline Solids, 352 (2006), pp. 4758-4762.

Cray Valley, SMA 2000 Technical Data Sheet (2016).

International Search Report issued in connection with International Application No. PCT/US2013/054396 dated Sep. 30, 2013.

LIQUID COMPRESSION MOLDING ENCAPSULANTS

BACKGROUND

Field

Thermosetting resin compositions useful for liquid compression molding encapsulation for fan-out wafer level packaging application are provided. The so-encapsulated wafer of casting compound with embedded silicon chips offers improved resistance to warpage, compared to encapsulation with known materials.

Brief Description of Related Technology

Liquid compression molding for fan-out wafer level packaging applications in the semiconductor packaging industry involves the coating of a protective material on a carrier on which is disposed one or more diced silicon dies picked and then placed there. The gaps and edges around the silicon dies are filled with the protective material to form a molded wafer.

Conventional materials used to form the molded wafer have either not possessed the desired physical properties to offer improved resistance to wafer warpage, or have not lent themselves to application by liquid compression molding techniques.

It would be desirable therefore to provide encapsulation by liquid compression molding to silicon wafers materials suitable for application, which are thermosetting resin compositions capable of providing improved resistance to wafer warpage.

SUMMARY

Thermosetting resin compositions that are capable of reducing, after cure, molded wafer warpage are provided. More specifically, thermosetting resin compositions useful as liquid compression molding encapsulants having low warpage after compression molding and oven cure, while maintaining the physical properties of a molding compound, in the invention composition are provided. The compositions exhibit low modulus at room temperature (such as about 22 GPa or less, desirably within the range of about 5 to about 9 Gpa, at room temperature), low coefficients of thermal expansion ("CTEs") ($\alpha 1 \leq 10$ ppm), and multiple glass transition temperatures ("Tgs") [$T_{g1}$ about $-70°$ C. to $-30°$ C. (such as $-48°$ C.), and $T_{g2}$ about $100°$ C. to $150°$ C. (such as $140°$ C.). This physical property combination shows promise in overcoming some of the significant technical hurdles facing the semiconductor packaging industry at present, particularly with respect to wafer warpage.

Thus provided in one aspect is a thermosetting resin composition, which when cured forms a network of reacted products showing two or more Tg's by Differential Scale calorimetry ("DSC"). The components of these compositions include a thermosetting resin matrix (such as an epoxy resin component), a block copolymer, a filler, and a cure component comprising the combination of an anhydride or a phenolic resin and an imidizole.

In another aspect, provided is a method of improving warpage resistance to a molded wafer, steps of which include:

providing a carrier on which is disposed one or more silicon chips;

providing a thermosetting resin composition as so described in contact with the carrier; and exposing the silicon chips and the thermosetting resin composition to conditions favorable to allow the thermosetting resin composition to flow about the wafer and cure to a reaction product of the thermosetting resin composition. The cured reaction product is capable of improving warpage resistance of the molded wafer by about 65%, desirably at least about 50%, and even more desirably at least about 80%, as compared with a molded wafer with a material other than that which is disclosed herein.

DETAILED DESCRIPTION

The thermosetting resin compositions as noted above, include among other constituents a thermosetting resin matrix (such as an epoxy resin component).

Examples of the epoxy resin component include epoxies made from bisphenol A, bisphenol F, bisphenol S, bisphenol E, biphenyl or combinations thereof. In addition, two or more different bisphenol epoxies (or hydrogenated versus thereof) within the same type of resin (such as A, F, S or E) may be used.

Commercially available examples of the bisphenol epoxies desirable for use herein include bisphenol-F epoxies [such as RE-404-S from Nippon Kayaku, Japan, and EPICLON 830 (RE1801), 830S (RE1815), 830A (RE1826) and 830W from Dai Nippon Ink & Chemicals, Inc., and RSL 1738 and YL-983U from Resolution] and bisphenol-A epoxies (such as YL-979 and 980 from Resolution).

The bisphenol epoxies available commercially from Dai Nippon and noted above are promoted as liquid undiluted epichlorohydrin-bisphenol F epoxies having lower viscosities than conventional epoxies based on bisphenol A epoxies and have physical properties similar to liquid bisphenol A epoxies. Bisphenol F epoxy has a lower viscosity than bisphenol A epoxy, all else being the same between the two types of epoxies, which affords a lower viscosity and thus a fast flow underfill sealant material. The EEW of these four bisphenol F epoxies is between 165 and 180. The viscosity at $25°$ C. is between 3,000 and 4,500 cps (except for RE1801 whose upper viscosity limit is 4,000 cps). The bisphenol A epoxies have a EEW (g/eq) of between 180 and 195 and a viscosity at $25°$ C. of between 100 and 250 cps.

The bisphenol epoxies available commercially from Resolution and noted above are promoted as low chloride containing liquid epoxies. The total chloride content for the RSL-1738 bisphenol A epoxy is reported as between 500 and 700 ppm, and that for YL-983U as between 150 and 350 ppm.

Among the epoxies suitable for use herein also include polyglycidyl derivatives of phenolic compounds, such as those available commercially under the tradename EPON, such as EPON 828, EPON 1001, EPON 1009, and EPON 1031 from Resolution; DER 331, DER 332, DER 334, and DER 542 from Dow Chemical Co.; and BREN-S from Nippon Kayaku. Other suitable epoxies include polyepoxides prepared from polyols and the like and polyglycidyl derivatives of phenol-formaldehyde novolacs, the latter of such as DEN 431, DEN 438, and DEN 439 from Dow Chemical. Cresol analogs are also available commercially under the tradename ARALDITE, such as ARALDITE ECN 1235, ARALDITE ECN 1273, and ARALDITE ECN 1299 from Ciba Specialty Chemicals Corporation. SU-8 is a bisphenol-A-type epoxy novolac available from Resolution. Polyglycidyl adducts of amines, aminoalcohols and polycarboxylic acids are also useful in this invention, commercially available resins of which include GLYAMINE 135, GLYAMINE 125, and GLYAMINE 115 from F.I.C. Corporation; ARALDITE MY-720, ARALDITE 0500, and ARALDITE 0510 from Ciba Specialty Chemicals and PGA-X and PGA-C from the Sherwin-Williams Co.

In addition to the bisphenol epoxies, other epoxy compounds may be included within the epoxy component. For instance, cycloaliphatic epoxies, such as 3,4-epoxycyclohexylmethyl-3,4-epoxycyclohexylcarbonate, or hydrogenated versions of the bisphenol or biphenyl epoxies may be used.

Also monofunctional, difunctional or multifunctional reactive diluents to adjust the viscosity and/or lower the Tg are also used, such as butyl glycidyl ether, cresyl glycidyl ether, polyethylene glycol glycidyl ether or polypropylene glycol glycidyl ether. Appropriate monofunctional epoxy coreactant diluents for use herein include those that have a viscosity which is lower than that of the epoxy component, ordinarily, less than about 250 cps.

The monofunctional epoxy coreactant diluents should have an epoxy group with an alkyl group of about 6 to about 28 carbon atoms, examples of which include $C_{6-28}$ alkyl glycidyl ethers, $C_{6-28}$ fatty acid glycidyl esters and $C_{10-28}$ alkylphenol glycidyl ethers.

In the event such a monofunctional epoxy coreactant diluent is included, such coreactant diluent should be employed in an amount of up to about 5 percent by weight to about 15 percent by weight, such as about 8 percent by weight to about 12 percent by weight, based on the total weight of the composition.

The epoxy resin component should be present in the composition in an amount which the range of about 10 percent by weight to about 95 percent by weight, desirably about 20 percent by weight to about 80 percent by weight, such as about 60 percent by weight.

In addition to the epoxy resin component, other reactive components may be included such as an episulfide resin component, an oxazine component, an oxazoline component, a cyanate ester component, and/or a maleimide-, a nadimide- or an itaconimide-containing component.

As an episulfide resin, any of the aforementioned epoxies may be used where the oxirane oxygen atom has been replaced by a sulfur atom.

Oxazines may be embraced by the structure where here $R_1$-$R_8$ are each individually members selected from hydrogen, $C_{1-40}$ alkyl, $C_{2-40}$ alkenyl, the latter two of which being optionally interrupted by one or more of O, N, S, C=O, COO, or NHC=O or substituted by one or more of OH, OR, NRR, SH, SR, COOH, COOR, NHCOOH or NHCOOR, where R is selected from $C_{1-40}$ alkyl, $C_{2-40}$ alkenyl, or $C_{6-20}$ aryl,

X is a linkage selected broadly from alkylene, alkenylene, or arylene, optionally interrupted by one or more of O, NR, S, C=O, COO, or NHC=O or substituted by one or more of OH, OR, NRR, SH, SR, COOH, COOR, NHCOOH or NHCOOR, where R is selected from $C_{1-40}$ alkyl, $C_{2-40}$ alkenyl, or $C_{6-20}$ aryl, m and n are each individually 1 or 2, and k is 0 to 6.

The oxazine resin component should be present in the composition in an amount which the range of about 10 percent by weight to about 95 percent by weight, desirably about 20 percent by weight to about 80 percent by weight, such as about 60 percent by weight.

A more specific example of the oxazine resin component is a benzoxazine resin, examples of which may be embraced by where o is 1-4, X is defined below, and $R_1$ is alkyl, such as methyl, ethyl, propyls or butyls, or where p is 1-4, Y is defined below, and $R_4$ is selected from hydrogen, halogen, alkyl or alkenyl.

X and Y in the benzoxazine structures above may independently be selected from a monovalent or polyvalent radical that include hydrocarbyl or substituted hydrocarbyl species typically having in the range of about 6 up to about 500 carbon atoms, where the hydrocarbyl species is selected from alkyl, alkenyl, alkynyl, cycloalkyl, cycloalkenyl, aryl, alkylaryl, arylalkyl, arylalkenyl, alkenylaryl, arylalkynyl or alkynylaryl, provided, however, that X can be aryl only when X comprises a combination of two or more different species;

hydrocarbylene or substituted hydrocarbylene species typically having in the range of about 6 up to about 500 carbon atoms, where the hydrocarbylene species are selected from alkylene, alkenylene, alkynylene, cycloalkylene, cycloalkenylene, arylene, alkylarylene, arylalkylene, arylalkenylene, alkenylarylene, arylalkynylene or alkynylarylene, heterocyclic or substituted heterocyclic species typically having in the range of about 6 up to about 500 carbon atoms, polysiloxane, and polysiloxane-polyurethane block copolymers, and combinations of one or more of the above with a linker selected from covalent bond, —O—, —S—, —NR—, —NR—C(O)—, —NR—C(O)—O—, —NR—C(O)—NR—, —S—C(O)—, —S—C(O)—O—, —S—C(O)—NR—, —O—S(O)₂—, —O—S(O)₂—O—, —O—S(O)₂—NR—, —O—S(O)—, —O—S(O)—O—, —O—S(O)—NR—, —O—NR—C(O)—, —O—NR—C(O)—O—, —O—NR—C(O)—NR—, —NR—O—C(O)—, —NR—O—C(O)—O—, —NR—O—C(O)—NR—, —O—NR—C(S)—, —O—NR—C(S)—O—, —O—NR—C(S)—NR—, —NR—O—C(S)—, —NR—O—C(S)—O—, —NR—O—C(S)—NR—, —O—C(S)—, —O—C(S)—O—, —O—C(S)—NR—, —NR—C(S)—, —NR—C(S)—O—, —NR—C(S)—NR—, —S—S(O)₂—, —S—S(O)₂—O—, —S—S(O)₂—NR—, —NR—O—S(O)—, —NR—O—S(O)—O—, —NR—O—S(O)—NR—, —NR—O—S(O)₂—, —NR—O—S(O)₂—O—, —NR—O—S(O)₂—NR—, —O—NR—S(O)—, —O—NR—S(O)—O—, —O—NR—S(O)—NR—, —O—NR—S(O)₂—O—, —O—NR—S(O)₂—NR—, —O—NR—S(O)₂—, —O—P(O)R₂—, —S—P(O)R₂—, or —NR—P(O)R₂—; where each R is independently hydrogen, alkyl or substituted alkyl.

When one or more of the above described "X" or "Y" linkages cooperate to form the appendage of a benzoxazine group, as readily recognized by those of skill in the art, a wide variety of organic chains can be produced, such as, for example, oxyalkyl, thioalkyl, aminoalkyl, carboxylalkyl, oxyalkenyl, thioalkenyl, aminoalkenyl, carboxyalkenyl, oxyalkynyl, thioalkynyl, aminoalkynyl, carboxyalkynyl, oxycycloalkyl, thiocycloalkyl, aminocycloalkyl, carboxycycloalkyl, oxycloalkenyl, thiocycloalkenyl, aminocycloalkenyl, carboxycycloalkenyl, heterocyclic, oxyheterocyclic, thioheterocyclic, aminoheterocyclic, carboxyheterocyclic, oxyaryl, thioaryl, aminoaryl, carboxyaryl, heteroaryl, oxyheteroaryl, thioheteroaryl, aminoheteroaryl, carboxyheteroaryl, oxyalkylaryl, thioalkylaryl, aminoalkylaryl, carboxyalkylaryl, oxyarylalkyl, thioarylalkyl, aminoarylalkyl, carboxyarylalkyl, oxyarylalkenyl, thioarylalkenyl, aminoarylalkenyl, carboxyarylalkenyl, oxyalkenylaryl, thioalkenylaryl, aminoalkenylaryl, carboxyalkenylaryl, oxyarylalkynyl, thioarylalkynyl, aminoarylalkynyl, carboxyarylalkynyl, oxyalkynylaryl, thioalkynylaryl, aminoalkynylaryl or carboxyalkynylaryl, oxyalkylene, thioalkylene, aminoalkylene, carboxyalkylene, oxyalkenylene, thioalkenylene, aminoalkenylene, carboxyalkenylene, oxyalkynylene, thioalkynylene, aminoalkynylene, carboxyalkynylene, oxycycloalkylene, thiocycloalkylene, aminocycloalkylene, carboxycycloalkylene, oxycycloalkenylene, thiocycloalkenylene, aminocycloalkenylene, carboxycycloalkenylene, oxyarylene, thioarylene, aminoarylene, carboxyarylene, oxyalkylarylene, thioalkylarylene, aminoalkylarylene, carboxyalkylarylene, oxyarylalkylene, thioarylalkylene, aminoarylalkylene, carboxyarylalkylene, oxyarylalkenylene, thioarylalkenylene, aminoarylalkenylene, carboxyarylalkenylene, oxyalkenylarylene, thioalkenylarylene, aminoalkenylarylene, carboxyalkenylarylene, oxyarylalkynylene, thioarylalkynylene, aminoarylalkynylene, carboxy arylalkynylene, oxyalkynylarylene, thioalkynylarylene, aminoalkynylarylene, carboxyalkynylarylene, heteroarylene, oxyheteroarylene, thioheteroarylene, aminoheteroarylene, carboxyheteroarylene, heteroatom-containing di- or polyvalent cyclic moiety, oxyheteroatom-containing di- or polyvalent cyclic moiety, thioheteroatom-containing di- or polyvalent cyclic moiety, aminoheteroatom-containing di- or polyvalent cyclic moiety, carboxyheteroatom-containing di- or polyvalent cyclic moiety, and the like.

The benzoxazine resin component should be present in the composition in an amount which the range of about 10 percent by weight to about 95 percent by weight, desirably about 20 percent by weight to about 80 percent by weight, such as about 60 percent by weight.

As a cyanate ester component, compounds having the general structural formula below may be used:

$$R^1\text{---}(O\text{---}C\equiv N)_m \qquad (I)$$

where here m is from 2 to 5 and $R^1$ is an aromatic nucleus-containing residue. $R^1$ should contain at least 6 carbon atoms and may be derived, for example, from aromatic hydrocarbons, such as benzene, biphenyl, naphthalene, anthracene, pyrene or the like. The aromatic residue may be also be derived from a polynuclear aromatic hydrocarbon in which at least two aromatic rings are attached to each other through a bridging group, such as where the bridging member has the formula where $R_a$ and $R_b$ are the same or different and each represents a hydrogen atom or an alkyl group containing 1 to 4 carbon atoms. $R^1$ also includes residues derived from novolac-type phenolic resins—i.e. cyanate esters of these phenolic resins. $R^1$ may also contain further ring attached, non-reactive substituents.

Examples of useful cyanate esters include, for instance, 1,3-dicyanatobenzene; 1,4-dicyanatobenzene; 1,3,5-tricyanatobenzene; 1,3-, 1,4-, 1,6-, 1,8-, 2,6- or 2,7-dicyanatonaphthalene; 1,3,6-tricyanatonaphthalene; 4,4'-dicyanatobiphenyl; bis(4-cyanatophenyl)methane and 3,3',5,5'-tetramethyl, bis(4-cyanatophenyl)methane; 2,2-bis(3,5-dichloro-4-cyanatophenyl)propane; 2,2-bis(3,5-dibromo-4-dicyanatophenyl)propane; bis(4-cyanatophenyl)ether; bis(4-cyanatophenyl)sulfide; 2,2-bis(4-cyanatophenyl)propane; tris(4-cyanatophenyl)-phosphite; tris(4-cyanatophenyl) phosphate; bis(3-chloro-4-cyanatophenyl)methane; cyanated novolac; 1,3-bis[4-cyanatophenyl-1-(methylethylidene)]benzene and cyanated, bisphenol-terminated polycarbonate or other thermoplastic oligomer.

Other cyanate esters include cyanates disclosed in U.S. Pat. Nos. 4,477,629 and 4,528,366, the disclosure of each of which is hereby expressly incorporated herein by reference; the cyanate esters disclosed in U.K. Patent No. 1,305,702, and the cyanate esters disclosed in International Patent Publication No. WO 85/02184, the disclosure of each of which is hereby expressly incorporated herein by reference.

Particularly desirable cyanate esters for use herein are available commercially from Hunstman Advanced Materials, Tarrytown, N.Y. under the tradename "AROCY" [1,1-di(4-cyanatophenylethane)]. The structures of four desirable "AROCY" cyanate esters are

"AROCY" B-10

-continued

The cyanate ester resin component should be present in the composition in an amount which the range of about 10 percent by weight to about 95 percent by weight, desirably about 20 percent by weight to about 80 percent by weight, such as about 60 percent by weight.

As a maleimide, nadimide or itaconimide, compounds having the general respective structural formulae below may be used:

where here m is 1-15, p is 0-15, each $R^2$ is independently selected from hydrogen or lower alkyl (such as $C_{1-5}$), and J is a monovalent or a polyvalent radical comprising organic or organosiloxane radicals, and combinations of two or more thereof, such as are defined as "X" and "Y" with respect to the benzoxazine structure above.

Monovalent or polyvalent radicals include hydrocarbyl or substituted hydrocarbyl species typically having a range of about 6 up to about 500 carbon atoms. The hydrocarbyl species may be alkyl, alkenyl, alkynyl, cycloalkyl, cycloalkenyl, aryl, alkylaryl, arylalkyl, aryalkenyl, alkenylaryl, arylalkynyl and alkynylaryl.

Additionally, X may be a hydrocarbylene or substituted hydrocarbylene species typically having in the range of about 6 up to about 500 carbon atoms. Examples of hydrocarbylene species include but are not limited to alkylene, alkenylene, alkynylene, cycloalkylene, cycloalkenylene, arylene, alkylarylene, arylalkylene, arylalkenylene, alkenylarylene, arylalkynylene and alkynylarylene.

The maleimide, itaconamide or nadimide may be in liquid or solid form.

In a desired embodiment, the maleimide, itaconamide or nadimide functional groups are separated by a polyvalent radical having sufficient length and branching to render the maleimide containing compound a liquid. The maleimide, itaconamide or nadimide compound may contain a spacer between maleimide functional groups comprising a branched chain alkylene between maleimide, itaconamide or nadimide functional groups.

In the case of maleimide-containing compounds, the maleimide compound desirably is a stearyl maleimide, oleyl maleimide, a biphenyl maleimide or a 1,20-bismaleimido-10,11-dioctyl-eixosane or combinations of the above.

Again in the case of maleimide-containing compounds, the maleimide compound may be prepared by reaction of maleic anhydride with dimer amides or prepared from aminopropyl-terminated polydimethyl siloxanes, polyoxypropylene amines, polytetramethyleneoxide-di-p-aminobenzoates, or combinations thereof.

Particularly desirable maleimides and nadimides include where $R^5$ and $R^6$ are each selected from alkyl, aryl, aralkyl or alkaryl groups, having from about 6 to about 100 carbon atoms, with or without substitution or interruption by a member selected from silane, silicon, oxygen, halogen, carbonyl, hydroxyl, ester, carboxylic acid, urea, urethane, carbamate, sulfur, sulfonate and sulfone.

Other desirable maleimides, nadimides, and itaconimides include

-continued or

The maleimides, nadimides or itaconimides should be present in the composition in an amount which the range of about 10 percent by weight to about 95 percent by weight, desirably about 20 percent by weight to about 80 percent by weight, such as about 60 percent by weight.

Figure 2:
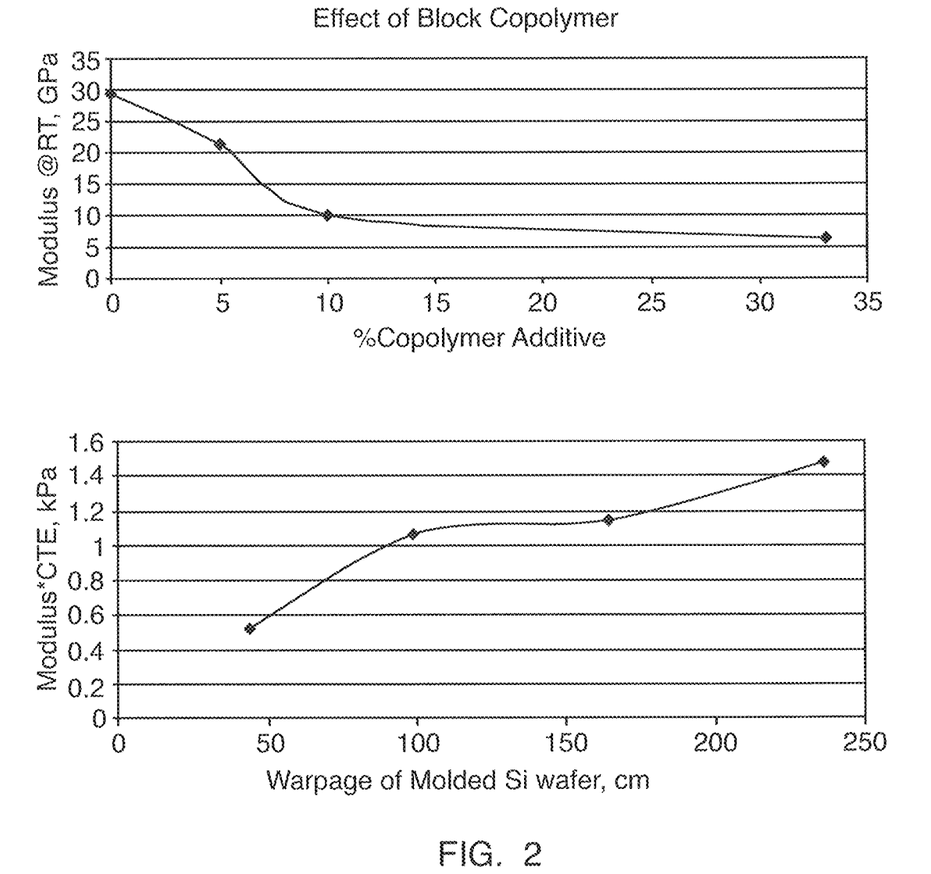
FIG. 2 depicts in the first part the effect of the addition of the block copolymer on the modulus, and in the second part the effect of the CTE on the warpage of the compression molded silicon wafer.

The block copolymer may be any block copolymer capable of contributing to the physical properties desired for the disclosed composition. The effect of the block copolymer on the modulus may be seen with reference to FIG. 2. Amphiphilic block copolymers are particularly desirable. Arkema offers for sale commercially an amphiphilic block copolymer under the trademark Nanostrength. Such block copolymers are currently available in two versions: SBM and MAM. The SBM copolymer is reportedly made of polystyrene, 1,4-polybutadiene and syndiotactic poly(m-ethyl methacrylate).

In addition, a polymer material constructed from polymethyl methacrylate ("PMMA") and polybutyl acrylate ("PB") may be used too. Polymer materials within this class are referred to as polymethylmethacrylate-block-polybutylacrylate-block polymethylmethacrylate copolymers ("MAM").

As reported by Arkema, MAM is a triblock copolymer, consisting of about 70% PMMA and 30% PB. MAM is constructed from distinct segments, which provides for the ability to self-assemble at the molecular scale. That is, M confers hardness to the polymer and A confers elastomeric properties to the polymer. A hard polymer segment tends to be soluble in cyanoacrylates, whereas the elastomeric segments provides toughness to the polymeric cyanoacrylate which forms upon cure. MAM also reinforces mechanical properties, without compromising inherent physical properties. MAM is commercially available under the tradename Nanostrength, at present under several different grades—i.e., E-21 [intermediate low molecular weight, medium butadiene content best toughening for PMMA friendly cross-linking agents (JEFFAMINE, MDEA)], E-41 [low molecular weight, low butadiene content, low viscosity, for use with PMMA friendly cross-linking agents (JEFFAMINE, MDEA)], M-22, M-22N, M-42, M-51 (low molecular weight, medium butyl acrylate content, low viscosity), and M-52N.

Arkema promotes the Nanostrength product line as an acrylic block copolymer that is miscible with many polymers, most of which according to the manufacturer are major industrial epoxy resins. See also U.S. Pat. No. 6,894,113, where in its abstract the '113 patent speaks to a thermoset material with improved impact resistance. The impact resistance is derived from 1 to 80% of an impact modifier comprising at least one copolymer comprising S-B-M, B-M and M-B-M blocks, where each block is connected to the other by a covalent bond or of an intermediary connected to one of the blocks by a covalent bond and to the other block by another covalent bond, M is a PMMA homopolymer or a copolymer comprising at least 50% by weight of methyl methacrylate, B is incompatible with the thermoset resin and with the M block and its glass transition temperature Tg is less than the operating temperature of the thermoset material, and S is incompatible with the thermoset resin, the B block and the M block and its Tg or its melting temperature is greater than the Tg of B.

Another commercially available example of an amphiphilic block copolymer is a polyether block copolymer known to the trade as FORTEGRA 100, from Dow Chemical Co. Dow describes FORTEGRA 100 as a low viscosity toughening agent designed for use as a high efficiency second phase, in amine cured epoxy systems. FORTEGRA 100 is reported to provide improved toughness without significantly affecting the viscosity, glass transition temperature, corrosion resistance, cure rate or chemical resistance of the final coating or composition. FORTEGRA 100 is also reported to be useful for formulation into standard bisphenol A and bisphenol F epoxy systems as it does not participate in the epoxy cure reaction. As a second phase toughening agent, FORTEGRA 100 is promoted as being effective when formulated at a specific volume fraction of the finish film or part, typically 3% to 8% by dry volume is said to achieve the toughening effect.

Additional block copolymers include those which comprise both hydrophobic and hydrophilic segments or portions, of the general formula:

where here $R^1$ is independently a hydrophobic olefin, such as ethylene, propylene, 1-butene, 1-hexene, 3-methyl-1-pentene, or 4-methyl-1-pentene or a polymerizable hydrophobic aromatic hydrocarbon such as styrene; each $R^2$ is a hydrophilic acid anhydride, such as maleic anhydride; v is from 1 to 12; w is from 1 to 6; and n is from 1 to 50.

Still other block copolymers may be a styrene maleic anhydride copolymer, represented by the formula:

where v is from 1 to 12; w is from 1 to 6; and n is from 1 to 50.

Styrene maleic anhydride copolymers are well known and some of which are available commercially from Sartomer Company, Inc., Exton, Pa. under the trade name SMA EF80, for example. Styrene maleic anhydride copolymers represent the copolymerization product of styrene and maleic anhydride and are characterized by alternating blocks of styrene and maleic anhydride moieties.

The ratio of the hydrophobic segments to the hydrophilic segments in the styrene maleic anhydride block copolymer may be at least 2:1, such as between 3:1 and 12:1. The hydrophilic segments in the block copolymer should comprise an anhydride, such as maleic anhydride. The hydrophobic segments in the block copolymer should comprise at least one of ethylene, propylene, 1-butene, 1-hexene, 3-methyl-1-pentene, 4-methyl-1-pentene, or styrene. Desirably, the block copolymer should be prepared with the hydrophilic segments comprising maleic anhydride and the hydrophobic segments comprising styrene.

Reference to the following U.S. patent documents shows amphiphilic block copolymers suitable for use herein, and as such are incorporated herein by reference. U.S. Pat. No. 7,745,535 is directed to and claims an amphiphilic multiblock copolymer where at least one block is a profiled block consisting of a) a hydrophilic middle block made from one or more monomeric units selected from acrylic acid, methacrylic acid, and the salts, esters, anhydrides and amides of acrylic acid and methacrylic acid; dicarboxylic acid anhydrides; carboxyethyl acrylate; and acrylamides; and b) hydrophobic end blocks where the multiblock copolymer is water insoluble, water indisperible, and not soluble or dispersible in $C_{1-3}$ alcohols.

U.S. Pat. No. 7,820,760 is directed to and claims a curable adhesive epoxy resin composition including (a) an epoxy resin; (b) an amphiphilic block copolymer containing at least one epoxy resin miscible block segments and at least one epoxy resin immiscible block segments (where the immiscible block segment comprises at least one polyether structure provided that the polyether structure of the immiscible block segment contains at least one or more alkylene oxide monomer units having at least four carbon atoms); and (c) at least one curing agent. The amphiphilic block copolymer in the '760 patent is an all polyether block copolymer such as a PEO-PBO diblock copolymer or a PEO-PBO-PEO triblock copolymer. The amphiphilic block copolymer is present in an amount such that when in the '760 patent the epoxy resin composition is cured, the bond strength of the resulting cured epoxy adhesive resin composition increases compared to an epoxy resin composition without the amphiphilic polyether block copolymer.

U.S. Pat. No. 7,670,649 is directed to and claims a curable ambient cure high-solids coating composition including (a) an epoxy resin; (b) an amphiphilic block copolymer containing at least one epoxy resin miscible block segment (where the immiscible block segment comprises at least one polyether structure provided that the polyether structure of the immiscible block segment contains at least one or more alkylene oxide monomer units) and at least one epoxy resin immiscible block segment; and (c) a sufficient amount of a nitrogen-containing curing agent to cure the coating composition at ambient temperature of less than about 60° C. When the epoxy resin composition is cured, the toughness of the resulting cured epoxy resin composition is increased.

U.S. Pat. No. 6,887,574 is directed to and claims a curable flame retardant epoxy resin composition including (a) at least one flame retardant epoxy resin; (b) at least one amphiphilic block copolymer; and (c) a curing agent. Such components are present in the curable composition in the appropriate amounts and ratios such that, upon curing, the block copolymer self-assembles into a nano structure morphology, such as a worm-like micelle morphology. The resulting cured product is reported to have a remarkably increased high fracture resistance; and allows the use of flame retardant epoxies in applications where fracture resistance is an issue.

U.S. Patent Application Publication No. 2008/0287595 is directed to a composition comprising (1) a thermosettable resin selected from an epoxy resin, an epoxy vinyl ester resin, an unsaturated polyester resin or a mixture thereof, and (2) an amphiphilic mock copolymer dispersed in the thermosettable resin. In addition, fiber-reinforced plastics (FRP), coatings and composites prepared from the composition are provided as well.

International Patent Publication No. WO 2010/008931 is directed to a structural composite that uses a block copolymer toughening agent to increase the fracture resistance (toughness) of the structural composite. The structural composite comprises (i) a carbon fiber reinforcing material and (ii) a thermosettable resin composition; wherein the thermosettable resin composition comprises (a) a thermosettable resin and (b) at least one block copolymer toughening agent.

International Patent Publication No. WO 2009/018193 is directed to curable compositions, cured compositions, and methods of forming the same, including an epoxy resin, a curing agent, an amphiphilic toughening agent, and an inorganic nanofiller, where the toughening agent forms a second phase having at least one dimension being on the nanometer scale.

Another example of a block polymer that may be used herein is a silane modified epoxy resin, which is made from:

as component (A) an epoxy component embraced by the following structure:

where Y may or may not be present and when Y present is a direct bond, $CH_2$, $CH(CH_3)_2$, $C=O$, or S, $R_1$ here is alkyl, alkenyl, hydroxy, carboxy and halogen, and x here is 1-4;

as component (B) a polymeric form of an epoxy-functionalized alkoxy silane embraced by the following structure:

where $R^1$ is an oxirane-containing moiety and $R^2$ is an alkyl or alkoxy-substituted alkyl, aryl, or aralkyl group having from one to ten carbon atoms; and as component (C) reaction products of components (A) and (B).

Figure 1:
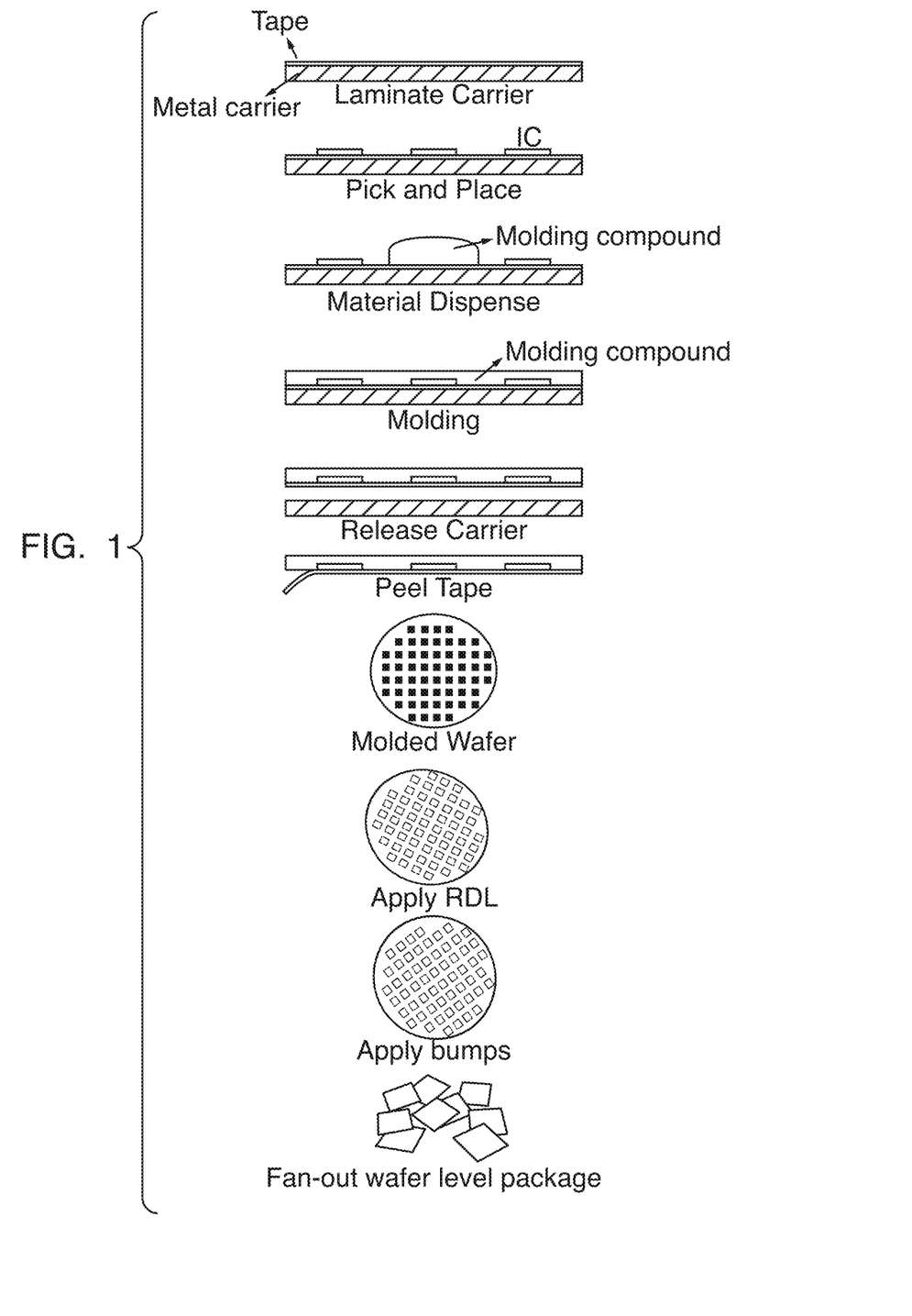
FIG. 1 depicts a process flow diagram of a liquid compression molding encapsulation process for fan-out wafer level packaging application.

An example of one such silane-modified epoxy is formed as the reaction product of an aromatic epoxy, such as a bisphenol A, E, F or S epoxy or biphenyl epoxy, and epoxy silane where the epoxy silane is embraced by the following structure:

where $R^1$ is an oxirane-containing moiety, examples of which include 2-(ethoxymethyl)oxirane, 2-(propoxymethyl)oxirane, 2-(methoxymethyl)oxirane, and 2-(3-methoxypropyl)oxirane and $R^2$ is an alkyl or alkoxy-substituted alkyl, aryl, or aralkyl group having from one to ten carbon atoms. In one embodiment, $R^1$ is 2-(ethoxymethyl)oxirane and $R^2$ is methyl. The polymeric form of such epoxy silane may be seen with reference to FIG. 1.

Idealized structures of the aromatic epoxy used to prepare the silane modified epoxy composition of matter include in one aspect is thus where Y may or may not be present and when Y present is a direct bond, $CH_2$, $CH(CH_3)_2$, $C=O$, or S, $R_1$ here is alkyl, alkenyl, hydroxy, carboxy and halogen, and x here is 1-4. Of course, when x is 2-4, chain extended versions of the aromatic epoxy are also contemplated as being embraced by this structure.

For instance, a chain extended version of the aromatic epoxy may be embraced by the structure below The silane modified epoxy is thus in one aspect a combination of the aromatic epoxy, a polymeric form of the epoxy silane, and reaction products of the aromatic epoxy and the epoxy silane. The reaction products may be prepared from the aromatic epoxy and epoxy silane in a by weight ratio of 1:100 to 100:1, such as a by weight ratio of 1:10 to 10:1.

The block copolymer may be used herein in an amount up to about 50 percent by weight, desirably from 5 to 40 percent by weight based on the total weight of the adhesive composition.

The Tg of a polymer is the temperature at which the polymer becomes brittle on cooling or soft on heating. More specifically, Tg defines a pseudo second order phase transition in which a polymer yields, on cooling, a glassy structure with properties similar to those of a crystalline material. Above Tg, the polymer becomes soft and capable of plastic deformation without fracture. While the Tg is occasionally described as the "softening temperature" of a polymer, it is not uncommon for the polymer to begin softening at a temperature below the Tg. This is because, due to the nature of many non-crystalline polymers, the softening of the polymer may occur over a temperature range rather than abruptly at a single temperature value. Tg generally refers to the middle point of this range even though the polymer may begin to soften at a different temperature. For purposes of this application, the Tg of a polymer refers to the value as determined by ASTM E-1356.

In addition to becoming brittle at temperatures below Tg, a polymer also generally becomes drier and less tacky than when that same polymer is heated to a temperature above its Tg.

Another block copolymer is the chain extended reaction product of diglycidyl ethers and bisphenol A together with the diglycidyl ether of bisphenol A. More specifically, depending on the molecular weight of the diglycidyl ether (for instance, polypropylene glycol diglycidyl ether) on higher or lower viscosity block copolymer can be obtained.

As a filler component, many materials are potentially useful. For instance, inorganic fillers may be useful, particularly where coefficients of thermal expansion ("CTE") between the semiconductor chip and the substrate to be mated and sealed are to be more closely matched. The filler influences the CTE and thus can be used to reduce thermal expansion of the cured material, thereby reducing warpage. The effect of CTE on the warpage may be seen with reference to FIG. 3. The filler component may often include reinforcing silicas, such as fused spherical silicas, and may be untreated or treated so as to alter the chemical nature of their surface. The filler component however should include particles having a mean particle size distribution in the 0.1 to 50 micron range. A commercially available example of such particles is sold by Tatsumori or Denka in Japan. In addition, nano-size silica powder might be added, such as those sold under the tradename NANOPDX by Nanoresins, Germany. NANOPDX fillers are monodisperse silica filler dispersions in epoxy resins, at a level of up to about 50 percent by weight, available from Nanoresins, Germany. NANOPDX fillers ordinarily are believed to have a particle size of about 5 nm to about 80 nm.

Nanoresins also produces materials under the NANOPDX E trade designations. For instance, Nanoresins reports NANOPDX E-brand products enable the complete impregnation of electronic components which are difficult to seal otherwise and provide a large spectrum of mechanical and thermal properties such as reduced shrinkage and thermal expansion, fracture toughness and modulus. In the table below, Nanoresins-provided information on the four noted NANOPDX E products is set forth:

| Type | $SiO_2$-Content [wt %] | Base resin | EEW [g/eq.] | Dyn. Visc., 25° C. [mPa · s] |
|---|---|---|---|---|
| NANOPOX E 430 | 40 | DGEBA/DGEBF | 290 | 45,000 |
| NANOPOX E 470 | 40 | DGEBA[1] | 295 | 60,000 |
| NANOPOX E 500 | 40 | DGEBF[2] | 275 | 20,000 |
| NANOPOX E 600 | 40 | EEC[3] | 220 | 4,000 |

[1] diglycidyl ester of bisphenol
[2] diglycidyl ester of bisphenol
[3] 3,4-epoxycyclohexylmethyl-3,4-epoxycyclohexylcarbonate Nanoresins reports that important properties can be significantly improved in epoxy formulations by using NANOPDX E-brand products. For instance:
  lower viscosity of the formulation in comparison to conventional reinforced fillers
  no sedimentation
  increase in the fracture toughness, impact resistance and modulus
  improved scratch and abrasion resistance
  reduction of shrinkage and thermal expansion
  improvement, or at least no negative effect, in numerous desired properties, such as thermal stability, chemical resistance, glass transition temperature, weathering resistance, and dielectric properties.

The processability is essentially unchanged in comparison to the respective base resin.

According to the manufacturer, NANOPDX E-brand products are a colloidal silica sol in an epoxy resin matrix. The dispersed phase consists according to the manufacturer of surface-modified, spherically shaped $SiO_2$ nanoparticles with diameters below 50 nm and an extremely narrow particle size distribution. These spheres, only a few nanometers in size, are distributed agglomerate-free in the resin matrix. This according to the manufacturer produces a very low viscosity of the dispersion with $SiO_2$ content of up to 40 percent by weight. As reported by the manufacturer, the nanoparticles are chemically synthesized from aqueous sodium silicate solution. In this process the binding agent is not damaged, in contrast to processes in which powdered fillers are dispersed with dissolvers or other equipment using high shear energy.

Other desirable materials for use as a filler component include those constructed of or containing aluminum oxide, silicon nitride, aluminum nitride, silica-coated aluminum nitride, boron nitride and combinations thereof.

The filler component, when used, should be used in an amount of about 50 to about 90 percent by weight of the composition, such as about 60 to about 90 percent by weight, desirably within the range of about 70 to about 90 percent by weight.

As the cure component, many different materials can be used depending upon the temperature at which cure is desired to occur. For instance to achieve cure at a temperature in the about 110° C. to about 180° C. range, a variety of materials may be used, such as anhydrides and imidazoles, particularly combinations thereof. Examples of the anhydrides include methylhexahydrophthalic anhydride ("MHHPA") (>95%) from Dixie Chemical Company Inc. and ECA 300D also from Dixie Chemical Company Inc. as a mixture of MHHPA (>87%) and methyltetrahydrophthalic anhydride (>7%); examples of the imidazoles include imidazole from Sigma-Aldrich Corporation, Curezol 1B2MZ (benzyl-2-methylimidazole) and Curezol 2P4MZ (2-phenyl-4-methylimidazole) from Air Products and Chemicals Inc.

The cure component should be present in an amount within the range of about 0.05 percent by weight to about 1 percent by weight, desirably about 0.1 percent by weight to about 0.5 percent by weight, of the total composition.

The anhydrides or phenolic resins and imidazoles should be present in an amount within the range of about 10 to 50% of the thermosetting resin composition.

The following examples are provided for illustrative purposes.

Examples

A reconfigured wafer is ordinarily constructed today to have an 8" or 12" diameter. In use, the thermosetting resin composition used to encapsulate the wafer may be dispensed by air pressure or by piston dispense on or about a central portion of the wafer.

Exposure to liquid compression molding conditions, such as at a temperature of about 100° C. to 120° C. for a period of time of about 300 to 400 seconds, follows. See e.g. FIG. 1. After such exposure, the compression molded wafer may be placed into a conventional oven for a post mold cure at a temperature about 120° C. to 150° C. for a period of time of about 15 minutes to 1 hour. Desirably, a 8", 970 um thick molded wafer should demonstrate warpage about less than 1 mm bow across of the wafer.

A control sample (Sample No. 1) prepared from bisphenol-A epoxy, cycloaliphatic epoxy and anhydride, without a block copolymer, was applied to a carrier on which is disposed silicon chips and molded as described above. Warpage of the molded wafer was observed to be modest using a Shadow Moirè in the X- and Y-directions, which uses non-contact and non-destructive methods to measure a whole-field surface topography of the molded wafers.

Using this technique, the warpage of the debonded wafer was measured. Then the wafer was annealed using a different temperature ramping process and the warpage was measured again.

As silica filler loading increases, viscosity increases tend to result and reduced flow and challenging dispensability is ordinarily observed.

In contrast, compositions including a thermosetting resin matrix (such as an epoxy resin component), block copolymer, a filler, and a cure component, showed reduced viscosity while maintaining a comparable CTE and Tg.

More specifically, reference to Table 1 shows two compositions formulated with the noted components in the stated amounts.

TABLE 1

| Components | | Sample No./Amt (wt %) | | | | | |
|---|---|---|---|---|---|---|---|
| Type | Identity | 1 Control | 2 | 3 | 4 | 5 | 6 |
| Curable Resin | RSL-1462[1] | 0.88 | 0.88 | 0.88 | 0.88 | 0.88 | 0.88 |
| | RSL-1739[2] | 0.44 | 0.44 | 0.44 | 0.44 | 0.44 | 0.44 |
| | HELOXY 68 | 0.74 | 0.74 | 0.74 | 0.74 | 0.74 | 0.74 |
| | CYRACURE UVR-6105[3] | 1.18 | 1.18 | 1.18 | 1.18 | 1.18 | 1.18 |
| | ARALDITE MY 510 | 0.74 | 0.74 | 0.74 | 0.74 | 0.74 | 0.74 |
| Block Copolymer | FORTEGRA-100 | | 5 | 1.1 | | | 0.5 |
| | TEPO | | | | 1.1 | | |
| | TEPO LV | | | | | 1.1 | |
| Silica Filler | MSV-8000 | 46.80 | 46.71 | 46.71 | 46.71 | 46.71 | 46.80 |
| | MSR-8030 | 43.00 | 42.92 | 42.92 | 42.92 | 42.92 | 43.00 |
| | AEROSIL R8200 | 0.2 | 0.2 | 0.2 | 0.2 | 0.2 | 0.2 |
| Curative | CUREZOL 1B2MZ | 0.2 | 0.2 | 0.2 | 0.2 | 0.2 | 0.2 |
| | ECA 300D[4] | 5.26 | 5.25 | 5.25 | 5.25 | 5.25 | 5.26 |
| Additives | SILQUEST A-187 J | 0.15 | 0.15 | 0.15 | 0.15 | 0.15 | 0.15 |
| | SILRES HP-1250 | 0.35 | 0.35 | 0.35 | 0.35 | 0.35 | 0.35 |
| | Defoamer | 0.05 | 0.05 | 0.05 | 0.05 | 0.05 | 0.05 |

[1]Bisphenol A epoxy resin, Resolution Performance Products LLC, Houston, TX
[2]Bisphenol F epoxy resin, Resolution Performance Products LLC, Houston, TX. It was used to make a carbon black premix
[3]CYRACURE UVR-6105, cycloaliphatic epoxy
[4]Alicyclic anhydride The compositions were each prepared by mixing together the noted constituents with a mechanical mixer until dissolution to a homogeneous solution was observed. The silica filler was then added with continued mixing for a period of time of about 30-60 minutes at room temperature until a viscous paste with a substantially uniform consistency was achieved. The remaining constituents were then mixed into the various samples, to form pastes, which were then transferred into containers until ready for use.

Reference to Table 2 below shows certain physical properties observed after cure. And specifically, mechanical properties of the noted samples such as modulus, CTEs, $\alpha_1$ and $\alpha_2$, and Tg] were measured after the samples were cured for a period of time of 15 minutes to 1 hour at a temperature of 120° C. to 150° C. in an oven.

TABLE 2

| Physical Properties | Sample Nos. | | | | | |
|---|---|---|---|---|---|---|
| | 1 | 2 | 3 | 4 | 5 | 6 |
| Viscosity (cps at 25° C.) | 250,000 | 213,300 | 214,000 | — | — | 322,500 |
| Density (g/cc) | 1.9 | 1.94 | 2.0076 | 2.0095 | 2.0099 | — |
| Filler loading (%) | 90 | 85.5 | 88.8 | 88.8 | 88.8 | 89.6 |
| DSC onset temp. (° C.) | 111 | 119 | 113 | 113 | 111 | 112 |
| DSC peak temp. (° C.) | 137 | 142 | 139 | 136 | 136 | 138 |
| DSC rxn. heat (J/g) | 30 | 34 | 36 | 37 | 37 | 34 |
| Tg (° C.) by TMA | 138 | 121 | 125.6 | 95.8 | 110 | 137 |
| CTE 1, ppm/° C. | 8 | 7 | 9.9 | 8.4 | 7.2 | 7.7 |
| CTE 2, ppm/° C. | 30 | 33 | 29.6 | 27.1 | 28.4 | 36.3 |
| Tg (° C.) by DMA by tanδ | 161 | −48, 148 | −47, 155 | 143 | 145 | −60 (broad), 147 |
| Storage modulus @ 25° C. (GPa) | 29.5 | 6.2 | 10 | 11.4 | 7.5 | 21.3 |

And warpage results are shown in Table 3 below for Sample No. 1 and Sample Nos. 2, 3 and 6, which are otherwise comparable to Sample No. 1 but contain a certain percentage by weight of FORTEGRA-100 (with the remaining constituents reduced in amounts proportionately).

TABLE 3

| Warpage after oven cure (cm) | Sample Nos./cm | | | | | |
|---|---|---|---|---|---|---|
| | 1 Control | 2 | 3 | 4 | 5 | 6 |
| Before annealing (x; y directions) | 0.83; 0.93 | 0.66; 0.36 | 0.47; 1.38 | 0.82; 0.74 | 0.66; 0.62 | 0.54; 0.66 |
| After annealing (x; y directions) | 1.43; 1.52 | 0.50; 0.54 | 0.78; 1.35 | 1.25; 1.29 | 1.95; 1.44 | 1.16; 1.14 |

The thermosetting resin compositions are dispensed onto and about the center of a reconfigured wafer as a carrier with silicon dies. After compression molding at a temperature of 100° C. to 120° C. for a period of time of 300 seconds to 400 seconds, the composition was observed to be about 60 to 80% cured, though with a tack free surface. Then, the so-molded wafer was placed into a conventional oven for post mold cure at a temperature of 120° C. to 150° C. for a period of time of 15 minutes to 1 hour.

The inventive composition may be dispensed onto the active side of a reconfigured wafer and molded under increased pressure (about 98 KN) and at an elevated temperature of about 120° C. for a period of time of about 400 seconds. The molded wafer assembly was then exposed to an elevated temperature of about 150° C. for a period of time of 1 hour. The mold wafer was then debonded, coated with a redistribution layer, solder bumps applied and thereafter diced into single semiconductor packages.

To achieve high Tg and low warpage on flip chip semiconductor packaging, low temperature curing conditions (below 120° C.), with compositions that exhibit fast gellation after exposure to such low temperature curing conditions have been shown to influence warpage. The Tg of the cured composition should be equal to or higher than the temperature used to cure the composition; the Tg should be higher than 90° C., desirably above 125° C. If the composition cures slowly or at a higher temperature, the stress free point between the die and substrate set is high. Warpage at room temperature results from cooling the compression molded semiconductor package to room temperature from the cure temperature.

To achieve high reliability for thermal cycle performance between −55° C. to 125° C. of such compression molded semiconductor packages, the liquid compression molding material should have Tg by TMA after reflow at 260° C. above 90° C. and desirably above 125° C., a DSC peak below 140° C., a delta temperature between the onset and the peak on DSC below 20° C.

The physical properties [such as modulus, CTE, $\alpha_1$ and $\alpha_2$, and Tg] of the control composition—Sample No. 1—were compared against the compositions of this invention—Sample Nos. 2, 3 and 6. The relationship between modulus and CTE $\alpha_1$ is illustrated graphically in FIG. 2. In general, one can see the modulus ranges of Sample Nos. 2, 3 and 6 are lower than that compared to the modulus range of Sample No. 1, while the CTE $\alpha_1$ values (and Tg, for that matter) remain in the same range. This combination of low modulus and low CTE $\alpha_1$ (and relatively high Tg) is a significant physical property combination for electronic materials, such as sealants, for use as encapsulants for microelectronic devices, particularly as a liquid compression molding material.

And the viscosity of the inventive composition actually decreases with the addition of the block copolymers, while allowing a reduction in the amount of silica filler in order to achieve CTE values within the same vicinity (within about 10%).

What is claimed is:

1. A liquid compression molding thermosetting resin encapsulant composition, comprising:
    a thermosetting resin component comprising an epoxy resin component, wherein the epoxy resin component comprises at least two different epoxies chosen from epoxies made from bisphenol A, bisphenol F, bisphenol S, bisphenol E, biphenyl, and combinations thereof,
    a polyether block copolymer present in an amount of about 0.5% to about 5% by weight, sufficient to reduce warpage in x and y directions when the encapsulant is compression molded and oven cured,
    a thermal expansion reducing additive comprising about 70% to about 90% by weight silica filler and
    a cure component present in an amount from about 0.05% to about 1% by weight, the cure component comprising the combination of an anhydride or a phenolic resin and an imidazole,
    wherein all % by weight are based on the total liquid compression molding thermosetting resin encapsulant composition,
    wherein, when compression molded and oven cured at a first temperature, the encapsulant composition has the following combination of warpage-reducing physical properties:
    a Tq1 of about −70° C. to about −30° C. as measured by DSC, and
    a Tg2 of a second temperature that is equal to or greater than the first temperature and that is about 100° C. to about 150° C. as measured by DSC".

2. A method of improving warpage resistance of a mold wafer encapsulated by a composition according to claim 1, the method comprising:
    providing a reconfigured wafer;
    providing a liquid compression molding thermosetting resin encapsulant composition according to claim 1 in contact with the wafer; and
    exposing the wafer and the liquid compression molding thermosetting resin encapsulant composition to conditions favorable to allow the thermosetting resin composition to flow about the wafer and cure to a reaction product of the thermosetting resin composition.

3. A product formed from the method of claim 2.

4. The composition of claim 1 wherein the thermosetting resin component further comprises an episulfide resin component, an oxazine component, an oxazoline component, a cyanate ester component, and/or a maleimide-, a nadimide- or an itaconimide-containing component.

5. The composition of claim 1, wherein the polyether block copolymer is amphiphilic.

6. The composition of claim 1, wherein the composition exhibits a DSC onset temperature and a DSC peak after reflow, wherein the DSC peak is below 140° C. and a difference between the DSC onset temperature and the DSC peak is less than 20° C.

* * * * *